(12) United States Patent
Pfeiffer-Wagner

(10) Patent No.: US 10,396,532 B1
(45) Date of Patent: Aug. 27, 2019

(54) CONTACT DEVICE FOR TRANSMITTING ELECTRICAL ENERGY

(71) Applicant: PSZ electronic GmbH, Vohenstrauß (DE)

(72) Inventor: Klaus Pfeiffer-Wagner, Weiden (DE)

(*) Notice: Subject to any disclaimer, the term of this patent is extended or adjusted under 35 U.S.C. 154(b) by 0 days.

(21) Appl. No.: 15/921,742

(22) Filed: Mar. 15, 2018

(30) Foreign Application Priority Data

Feb. 19, 2018 (DE) .......... 10 2018 103 667

(51) Int. Cl.
| | |
|---|---|
| *H02B 1/20* | (2006.01) |
| *H02B 1/42* | (2006.01) |
| *H02G 5/04* | (2006.01) |
| *H05K 7/14* | (2006.01) |
| *H02B 1/04* | (2006.01) |

(52) U.S. Cl.
CPC .............. *H02B 1/20* (2013.01); *H02B 1/042* (2013.01); *H02G 5/04* (2013.01); *H05K 7/1428* (2013.01)

(58) Field of Classification Search
CPC ........ H05K 7/1428; H02G 5/04; H02B 1/042; H02B 1/20
USPC .......... 361/624; 439/209, 214–216, 121, 122
See application file for complete search history.

(56) References Cited

U.S. PATENT DOCUMENTS

| | | | | |
|---|---|---|---|---|
| 4,218,108 A | * | 8/1980 | El Mouchi | ........... H01R 25/142 200/51 R |
| 6,113,401 A | * | 9/2000 | Nieminen | ............ H01R 25/142 439/121 |
| 6,241,065 B1 | | 6/2001 | Kohlenberg | |
| 6,722,918 B2 | * | 4/2004 | McCoy | ................. H01R 13/60 439/110 |
| 7,997,910 B2 | * | 8/2011 | Myers | .................. H01R 25/142 439/121 |
| 8,986,021 B2 | * | 3/2015 | Keswani | .............. H01R 25/142 439/110 |
| 9,929,522 B2 | * | 3/2018 | Pfeiffer-Wagner | ......................... H01R 25/142 |
| 10,041,662 B2 | * | 8/2018 | Sonneman | ................ F21S 4/28 |
| 2017/0194757 A1 | | 7/2017 | Pfeiffer-Wagner | |
| 2018/0183195 A1 | * | 6/2018 | Pfeiffer-Wagner | ......................... H01R 25/142 |

FOREIGN PATENT DOCUMENTS

| | | | | |
|---|---|---|---|---|
| DE | 9201364 U1 | | 7/1993 | |
| DE | 19849101 A1 | * | 4/1999 | ............. F21S 8/065 |
| DE | 2016000059 A1 | | 7/2017 | |
| WO | 2014143020 A1 | | 9/2014 | |

OTHER PUBLICATIONS

German Search Report, German Patent Application No. 18173818.8-1201; dated Nov. 27, 2018, 4 pages.
German Examination Report, German Patent Application No. 10 2018 103 667.1; dated Nov. 12, 2018, 6 pages.

* cited by examiner

*Primary Examiner* — Anatoly Vortman
(74) *Attorney, Agent, or Firm* — Michael J. Gallagher; Luper Neidenthal & Logan

(57) ABSTRACT

The present invention relates to a contact device for transmitting electrical energy from a preferably spatially fixed bus bar to a tap-off device which is movable along the bus bar or is likewise spatially fixed. For this purpose, the sliding contact elements are configured in the form of sliding clip elements so that the connecting housing of the contact device is clippable onto the bus bar without using tools.

16 Claims, 2 Drawing Sheets

CONTACT DEVICE FOR TRANSMITTING ELECTRICAL ENERGY

CROSS-REFERENCE TO RELATED APPLICATIONS

Not applicable.

FIELD OF THE INVENTION

The present invention relates to a contact device for transmitting electrical energy from a bus bar, which may be spatially fixed or movable, to a tap-off device, which is likewise spatially fixed or movable.

BACKGROUND OF THE INVENTION

The bus bar may be an arrangement of a plurality of elongated electrical conductors laid in parallel to one another, mounted individually or together in additional insulation elements, which may, by way of example only and not limitation, be plastic bodies. Moreover, the bus bar can may be fixedly mounted in a manufacturing facility, for example, on a floor, without the bus bar moving relative to the floor during operation of the bus bar. The individual electrical conductors may be guided in the form of a bar, preferably also along a bar or in the form of a bar guide.

In order to continuously supply electrical energy, for example, to a production robot, a tap-off device may be installed between the bus bar and an electrically operated production robot or other electrically operated device of this type.

The tap-off device may be movable along the bus bar, preferably together with such a robot as mentioned; however, the tap-off device may be maintained in constant electrical contact with the bus bar during such movement. In alternate embodiments, both components, the bus bar, and the tap-off device, can be spatially fixed and non-movable.

The tap-off device thus allows a continuous supply of electrical energy to the robot or to the other electrical devices envisioned, regardless of the point at which the robot is located relative to the bus bar, provided that the tap-off device is in reliable and continuous electrical contact with the bus bar.

Thus, a device may be required which brings the bus bar and the tap-off bar device into contact with each other in a reliable and electrically continuous, conductive manner. The contact device, as described in several embodiments below, serves this purpose.

BRIEF SUMMARY OF THE INVENTION

The present invention described here, in multiple embodiments, relates to a contact device for transmitting electrical energy from a bus bar, which may be spatially fixed or movable, to a tap-off device which may likewise be spatially fixed or be movable along the bus bar. The contact device may include at least one connecting housing, mechanically connecting the bus bar and the tap-off device via a the connecting housing. For this purpose, the connecting housing may include at least one base carrier, upon which a connecting element, for example, at least one terminal clamp, may be installed.

The tap-off device may be a component separate from the contact device. For example, the tap-off device may be releasably connectable with the contact device. The tap-off device may be a component of a production element, by way of example only and not limitation, a robot, or the tap-off device may be connected, mechanically, electrically or both, between the contact device and the production element.

A base carrier can be formed as a base plate and may be made of an electrically insulating material upon which electrical lines are laid. For such purpose, a plastic or ceramic material may be used.

Moreover, the contact device may include a power tap-off device, which again may include at least one sliding contact element for diverting electrical energy from the bus bar. The sliding contact elements may be guided through the base carrier and may have a contacting area on the side of the base carrier facing away from the bus bar. At least one printed circuit board of the contact device and/or at least one printed circuit board of the tap-off device may be contactable in an electrically conductive manner. "Circuit boards," as the term is used in this specification, means those control components of outside electrical devices which may be attached to the bus bar (1) via the connecting housing (10), and receive electrical current thereby. For example, the sliding contact elements may be configured in the form of sliding clip elements so that the connecting housing is clippable on the bus bar without using tools.

In terms of the present invention, the sliding clip element can be an element which can be disposed from one direction at a line of the bus bar and a plug connection results between the bus bar and even between the line itself and the connecting housing during the positioning process. In such an instance, the plug connection may be configured in the form of a plug and play connection.

The plug connection may also be configured in the form of a clip connection. Such a clip connection may include a snap element, e.g., the clip, which, after latching, positions itself around a line of the bus bar.

According to at least one embodiment, the mechanical connection between the connecting housing may be established by laterally sliding, i.e., clipping, the sliding contact connection, in particular the clip connection, onto each line. The connection between the connecting housing and the bus bar may be free from any additional fastening elements, such as screws, adhesive, bolts and similar tensioning elements.

According to at least one embodiment, the contact device for transmitting electrical energy from a fixed or movable bus bar may be connected to a tap-off device that is likewise spatially fixed or movable. The contact device may include at least one connecting housing, the bus bar being mechanically connected via the connecting housing to the tap-off device. The connecting housing may include at least one base carrier, upon which connecting elements are installed, for example, possibly including at least one terminal clamp. Moreover, the contact device may include a power tap-off device, which includes sliding contact elements for discharging electrical energy from the bus bar. In one embodiment, the sliding contact element may be guided through the base carrier and have a contact area on the side of the base carrier facing away from the bus bar, which with the aid of various connecting components as would be known to one skilled in the art, such as at least one printed circuit board either on the contact device or the tap-off device, may be contactable in an electrically conductive manner.

The sliding contact elements may be configured in the form of sliding clip elements so that the connecting housing is clippable on to the bus bar without using tools.

According to at least one embodiment, the connecting housing, as it is shown in a non-limiting manner, may be at least partially or completely produced with the aid of the following three-dimensional ("3D") printing technologies.

3. The FDM Method (Fused Deposition Modeling)
Alternative Names: Fused Filament Fabrication (FFF), Fused Layer Modeling (FLM).

This method describes the layered application (extrusion) of a material through a hot nozzle. The consumable material is in the form of a long wire (a so-called filament) on a roll and is pushed by a conveyor unit into a print head, is melted therein and applied to a print bed. In the process, the print head and/or print bed may be movable in three directions. Layers of plastic can thus be applied in stages on top of one another.

4. The SLS Method (Selective Laser Sintering)

Unlike the classical sintering method, in which materials in powder form are combined with one another with heat, such combination occurs selectively in the SLS method using a laser (alternatively, an electron or infrared beam). Therefore, only a certain portion of a powder is molten together.

For this method, a thin layer of powder is constantly applied by a coating unit onto the print bed. The laser (or other energy source) is precisely aligned with individual points on the powder layer in order to form the first layer of printed data. In such instance, the powder is melted or fused and then solidifies again as the result of slight cooling. The powder which has not been melted remains lying around the sintered regions and serves as a support material. After a layer has solidified, the print bed may be lowered by a fraction of a millimeter. The coating unit may then travel across the print bed and applies the next layer of powder. Subsequently, a second layer may be printed, i.e., sintered, on top of the first layer by the laser (or another energy source). In this manner, a raised three-dimensional object may be gradually built up.

3. Three Dimensional Printing (3DP)

The 3DP method functions very similarly to selective laser sintering, but instead of a directed energy source, a print head travels across the powder. This releases tiny droplets of a binding agent onto the underlying powder layers, which in such a manner are connected to one another. Apart from this, this method is the same as the SLS method.

4. Stereolithography (SLA)

Instead of a plastic wire or print material in powder form, liquid resin, so-called photopolymers, are used in the stereolithography method. They are hardened in layers by UV radiation and in such manner produce three-dimensional objects. For this purpose, the platform may be gradually lowered in the resin vat. There are also variants (so-called polyjet methods) without an entire vat having liquid resin. For this method, an epoxy resin is applied in droplets from a nozzle and immediately hardened by a UV laser.

5. Laminated Object Manufacturing (LOM)
Alternative Name: Layered Laminated Manufacturing (LLM)

The LOM method is not based neither on a chemical reaction nor or a thermal process. In the LOM process, a film or plate (for example, paper) is cut along the contour with a cutting tool (for example, a knife or carbon dioxide laser) and bonded in layers on top of one another. In this way, a layered object made of bonded films laying on top of one another results by lowering the platform.

According to at least one embodiment, the connecting housing may be formed by a plastic material, which may be selected from a group which include polyethylene (PE), polyether/ether ketone (PEEK), polyoxymethylene, (POM), and in particular includes ultra-high-molecular-weight-polyethylene (UHMW-PE), (PP) polypropylene, (PA) polyamid—in particular PA46, PA6, PA 6.6, PA11 or PA12-PBT, polybutyletherphthalat, (PMP) polymethylpentene polyamide, and the like. In addition, combinations of these materials may be used. In many instances, the mentioned plastic materials are examples of plastics cross-linked by irradiation.

In general, the subsequently listed materials, which are not limiting, can be considered as suitable materials for the connecting housing. As noted, combinations of materials are possible, so the connecting unit may be formed of PC and ABS.

TABLE I

Materials Suitable for Fabrication Of The Connecting Unit

| Group of Materials | Modification | Shore D |
|---|---|---|
| ABS | | 75-93 |
| | ABS + 30 M.-% GF | 62-68 |
| | ABS/TPE | 46 |
| | ABS/TPU | 58-68 |
| ASA | | 75 |
| ETFE | | 60-78 |
| EVA | | 17-45 |
| PA 11 | PA 11 + 23 M.-% GF | 70 |
| PA 12 | PA 12 (standard moisture) | 75-78 |
| | PA 12 + 30 M.-% GF (standard | 75 |
| PA 612 | | 73 |
| PA 6 | PA 6 (standard moisture) | 52-77 |
| | PA 6 + 30 M.-% GF | 48-80 |
| | PA 6 + 30 M.-% GF (dry) | 84 |
| PA 66 | PA 66 + 30 M.-% GF | 77-82 |
| | PA 66 + 30 M.% GB | 81 |
| | PA 66 + 30 M.-% MX | 75-82 |
| PAEK | | 86-90 |
| | PAEK + 30 M.-% GF | 90 |
| PBI | | 99 |
| PBT | | 79-86 |
| | PBT + 30 M.-% GF | 53-85 |
| | PBT + 30 M.-% GX | 54 |
| PC | | 51-85 |
| | PC + 30 M.-% GF | 65-72 |
| | PC + 30 M.-% GX | 70 |
| PCTFE | | 76-80 |
| PE-HD | | 56-69 |
| PE-LD | | 39-83 |
| PE-LLD | | 38-60 |
| PE-MD | | 45-60 |
| PE-UHMW | | 60-65 |
| PEEK | | 83-88 |
| PEI | | 88-90 |
| PEK | | 87 |
| | PEK + 30 M.-% GF | 90 |
| PET | PET + 30 M.-% GF | 63-65 |
| PMMA | | 52-85 |
| | PMMA + 30 M.-% GF | 55 |
| POM | | 52-83 |
| PP | | 59-77 |
| | PP + 30 M.-% GF | 62-80 |
| | PP + 30 M.-% CD | 74-75 |
| | PP + 30 M.-% MF | 60-74 |
| | PP + 30 M.-% P | 65 |
| | PP + 30 M.-% CaC03 | 55-70 |
| | PP/EPDM | 40 |
| PS | | 78-80 |
| PTFE | | 50-90 |
| PUR | | 20-84 |
| PVC-U | | 74-94 |
| | PVC-U/NBR | 58-74 |
| PVC-P | | 42-77 |
| PVC-C | | 82 |
| PVDF | | 46-79 |
| SAN | | 45-85 |
| SMMA | | 72-82 |
| TPC | | 28-82 |
| TPE | | 48-78 |
| | TPE/PTFE | 56 |
| TPE-E | TPE-E + 30 M.-% GF | 55 |
| TPO | | 16-70 |

TABLE I-continued

Materials Suitable for Fabrication Of The Connecting Unit

| Group of Materials | Modification | Shore D |
|---|---|---|
| TPS | | 60 |
| TPU | TPU + 30 M.-% GF | 74-80 |
| TPV | | 40-51 |

Key to Table
GF: glass fibers
GB: glass beads
MF: mineral fibers
MX: unspecified mineral filling
GX: unspecified glass filling
CD: carbon powder
P: unspecified powder filling The connecting housing may be formed in the shape of a cuboid having a respective edge length of at least 20, to at most, 60 millimeters, although these dimensions are not intended to be limiting. Thus, the connecting housing, within which the connecting components are situated, may be an extremely small minimized unit in size.

The bus bar may have, for example, a 24V line (not shown) and a 48V line, while other voltages are equally feasible, and one GND line may be situated at each of the two lines for grounding. The bus bar in total could include four conductors running parallel to one another. It is possible that one of the two lines (24V or 48V) may serve as a terminal power supply for the power plug housing and for a production element (for example a robot) connected to this power plug housing.

According to at least one embodiment, the connecting housing has contacting ducts at one of the sides facing the bus bar, which run in a direction parallel to the bus bar and are open at least in places. At least one sliding contact element may extend at the interior surface of each contacting duct so that within the contacting ducts, one electrical line of the bus bar may be assigned to respectively one contacting duct, thereby being electrically contactable.

The contacting ducts can have a mechanical guide for the elongatedly formed sliding contact elements. One contacting duct, and one sliding contact element can thus be guided and mounted.

The sliding contact elements can, in particular in the area of the contacting ducts, be formed in a wave-shaped manner. Alternatively, or additionally, the sliding contact elements can be formed in the shape of a hook. In such an instance, it is conceivable that an end of the sliding contact formed as a hook is still completely mounted in the contacting duct and does not project from the contacting duct. Alternatively, it is also conceivable that the hooked end at least in sections projects from the contacting duct.

In addition to or instead of the sliding contact elements, the contacting ducts can be configured in the form of a plug device on the individual lines. In such embodiments, the contact ducts may themselves form a plug connection in the form of a clip connection. Such a clip connection may include a snap element (the clip) which, after latching, positions itself around a line of the bus bar. The snap elements can be moveably or fixedly disposed at the contacting duct, or it may be an element of the contacting duct.

According to at least one embodiment, by way of example and not limitation, the mechanical connection between the connecting housing may be established by laterally sliding, that is, clipping, the sliding contact connection, particularly the clip connection of the sliding contact connection onto each line.

According to at least one embodiment, at least one contacting duct extends away from the base carrier in a direction perpendicular to the main direction of extension of the base carrier. The bus bar may extend parallel or in a plane of the base carrier which is perpendicular to the main extension plane.

According to at least one embodiment, at least two contacting ducts may be situated one above the other in a direction parallel to the main extension plane of the base carrier. In some embodiments, the arrangement may be that of a stack of contacting ducts.

For this reason, one contacting duct may terminate in a main body of the connecting housing. Hence, the contacting duct may terminate as soon as it emerges, by its side edges, which are preferably extended perpendicular to the contact duct, into the main body.

According to at least one embodiment, at least one contacting duct is formed using plastic as a base material, at least one reinforcement element being encapsulated and/or disposed at least in places on the outside of the plastic. The reinforcing elements may have a higher Shore D value than the base material.

The reinforcement elements can be elongated reinforcement struts which may be, for example, applied parallel to a main direction of extension of the contact duct in the plastic material or on a surface of the plastic material. Laying the reinforcements struts in a perpendicular direction (for example, parallel to the direction of travel of the contact device) is also possible. Preferably, the reinforcement struts are made from a harder material than the base material of the connecting housing. In particular, the connecting struts can have a higher Shore D value than the base material. For example, in some embodiments, the reinforcement struts are manufactured form a metal, a plastic and/or a ceramic material.

According to at least one embodiment, the connecting housing has at least one interlocking element at one of the sides facing away from the bus bar. At least one power plug housing and/or at least one connector module or any other mechanical and/or electromechanical component may be mechanically installable in a fixed, but preferably releasable manner at the contact device.

The power plug housing may be configured as an element on the side of the line end, which connects a tap-off device and its electrical conductors at one of their ends in a mechanically fixed, but preferably releasable manner to the connecting housing. For this purpose, the power plug housing can be mechanically fixed on an installation surface of the base carrier in a releasable or non-releasable manner.

The interlocking elements can be fixedly connected at least by one of its ends to the base carrier or at least to the connecting housing. A connecting element of the power plug housing can be inserted into the interlocking element so that after the interlocking, the power plug housing is mechanically fixedly connected to the connecting housing.

According to at least one embodiment, the interlocking element is configured in the form of an interlocking hook, positionable at an outer periphery around the power plug housing, such that the power plug housing is held at the contact device by, and preferably only by, the interlocking elements.

In this instance, the interlocking hook can be fixedly or releasably fastened by one end to the base carrier of the connecting housing. A second end of the elongated interlocking hook can extend in a free-floating manner from the housing. The power plug housing can be inserted between this free end of the interlocking hook and the rest of the housing. After inserting the power plug housing, the interlocking hook can, for example at least partially, clamp the power plug housing to the housing of the contact device.

In this instance the power plug housing can be fastened in an electrically conductive manner to the sliding contact elements. For this purpose, the base carrier can have respective feedthroughs. The tap-off device can be the power plug housing or include such a power plug housing. According to at least one embodiment, the sliding contact elements are integrally formed with the contact device.

In the following detailed description the invention shown above is described in greater detail on the basis of exemplary embodiments and the corresponding illustrations.

BRIEF DESCRIPTION OF THE SEVERAL VIEWS OF THE DRAWINGS

Without limiting the scope of the as disclosed contact device for transmitting electrical energy herein and referring now to the drawings and figures.

Figure 1:
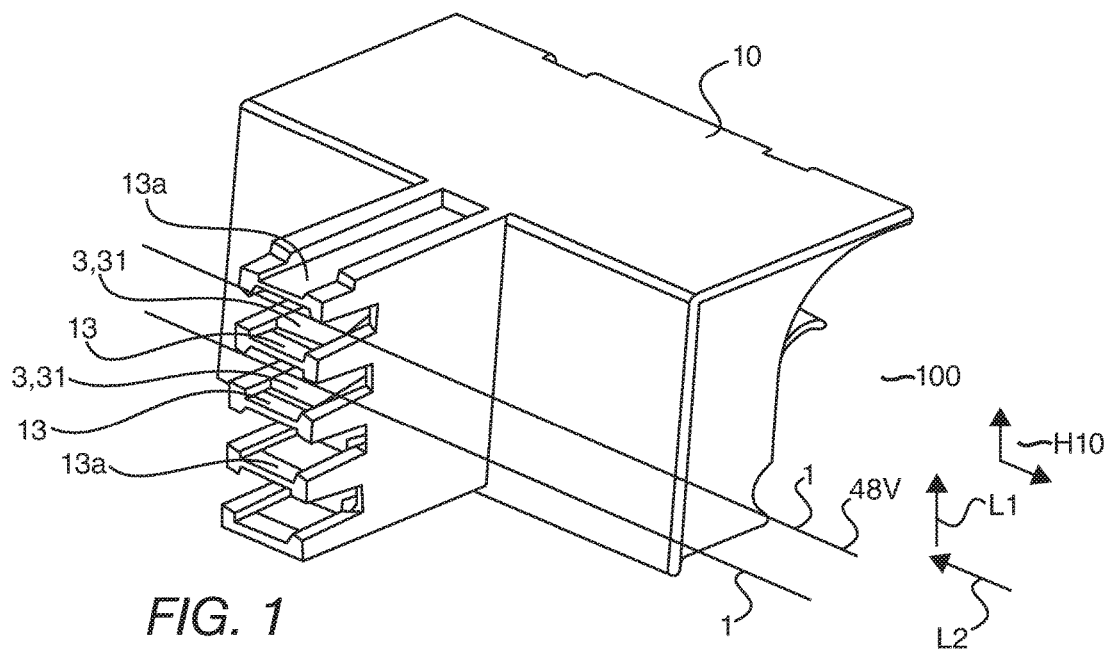
FIG. 1 is an elevated perspective view of an embodiment of a contact device for transmitting electrical energy.

These illustrations are provided to assist in the understanding of the exemplary embodiments of the contact device for transmitting electrical energy and materials related thereto described in more detail below and should not be construed as unduly limiting the specification. In particular, the relative spacing, positioning, sizing and dimensions of the various elements illustrated in the drawings may not be drawn to scale and may have been exaggerated, reduced or otherwise modified for the purpose of improved clarity. Those of ordinary skill in the art will also appreciate that a range of alternative configurations have been omitted simply to improve the clarity and reduce the number of drawings.

DETAILED DESCRIPTION OF THE INVENTION

Figure 2:
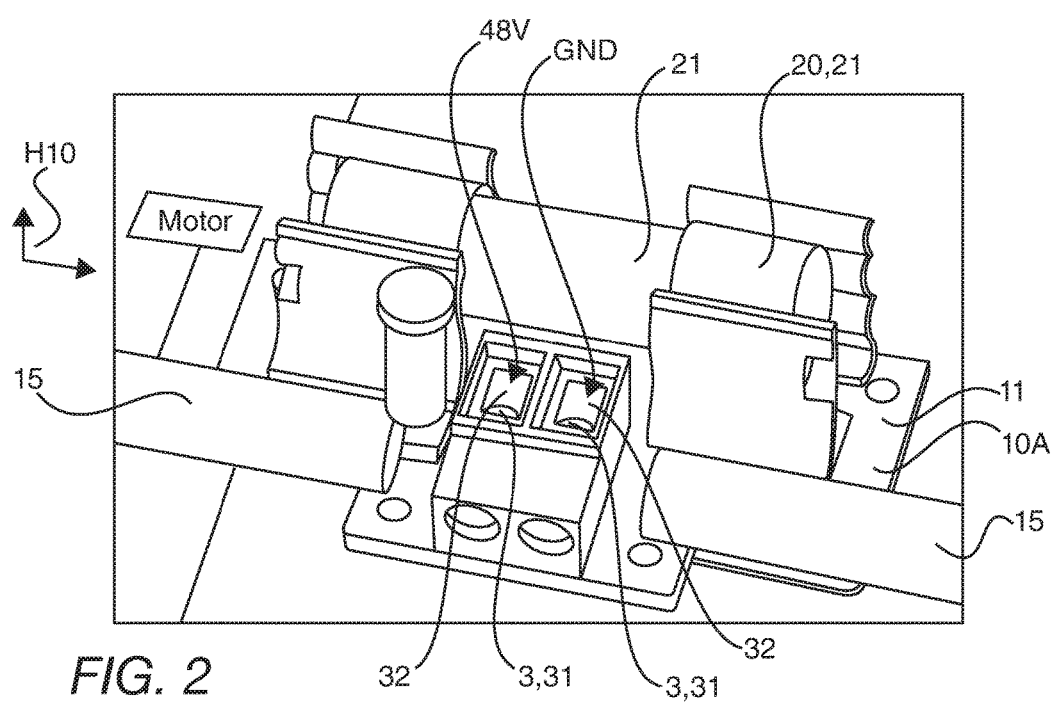
FIG. 2 is an elevated perspective view of another embodiment of a contact device for transmitting electrical energy.
Figure 3:
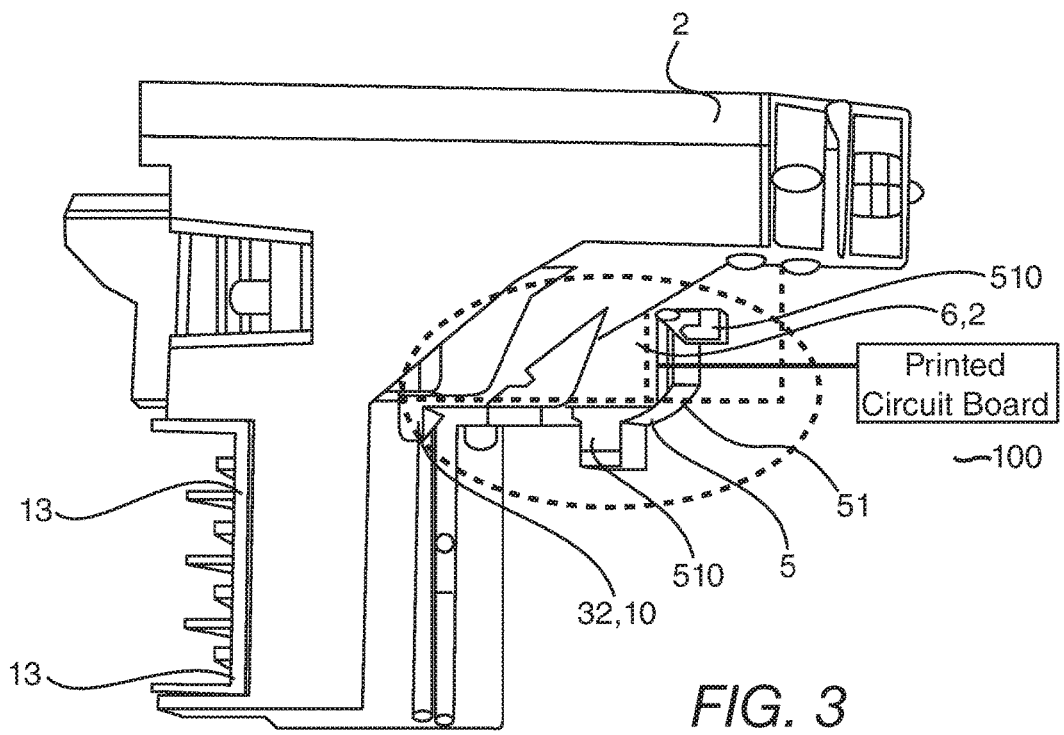
FIG. 3 is a side perspective view of another embodiment of a contact device for transmitting electrical energy.
Figure 4:
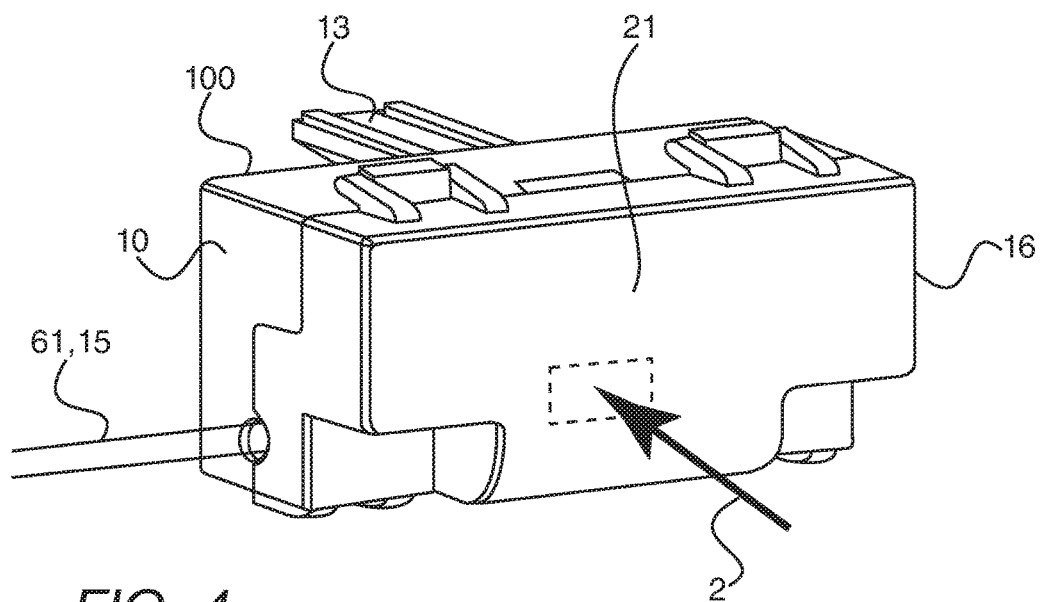
FIG. 4 is an elevated perspective view of another embodiment of a contact device for transmitting electrical energy.

FIGS. 1, 2, and 4 show a first exemplary embodiment in respective schematic perspective views of a contact device 100 here described. FIG. 3 shows a second exemplary embodiment of a here-described contact device 100.

In the figures, the same components or components having the same effect are denoted respectively with the same reference characters in the exemplary embodiments. The elements here illustrated are not to be understood as being to scale; rather, individual elements can be illustrated in an exaggeratedly large manner for better understanding.

FIG. 1 shows a schematic perspective view of a first exemplary embodiment of here-described contact device 100 for transmitting electrical energy from a preferably spatially fixed bus bar 1 to a (for reasons of simplification not illustrated in FIG. 1, see FIG. 4) tap-off device 2 which is movable along bus bar 1 or is likewise spatially fixed.

It can be seen from FIG. 1 that contact device 100 includes a connecting housing 10, bus bar 1 being mechanically connected to tap-off device 2 via connecting housing 10. In this instance, connecting housing 10 has a power tab-off device 3, power tab-off device 3 including sliding contact elements 31 for diverting electrical energy from bus bar 1.

A duct system projects from connecting housing 10, which is formed by contacting ducts 13 stacked one above the other in a direction L1. In each of contacting ducts 13, a sliding contact element 31 can be positioned and braced downwards in direction L1. In a sliding direction L2, contacting ducts 13 are open on both sides so that each sliding contact element 31 at all times and continuously can tab off the line of bus bar 1 assigned to it without difficulty. To this end, it is illustrated that on interior surfaces 13a of each contacting duct 13 a sliding contact element 31 runs and is braced.

In this instance, each contacting duct 13 extends away from a base carrier 10a of contact device 100 in a parallel direction to main extension plane H10, which is spanned by directions L1 and L2. Base carrier 10a is shown in FIG. 2, for example. As also can be seen from FIG. 1, a line 48V of bus bar 1 is a +48 Volt electric line and a GND line, for grounding the system or the electrical connection.

It can be seen from FIG. 2 that a protective circuit 21 is fastened on an installation surface 11 of base carrier 10a. Alternatively or additionally, any other connecting component can be fastened on this installation surface 11 of base carrier 10a. Also illustrated are contacting areas 32 which extend completely through base carrier 10a. In other words, contacting areas 32 are situated on the back side of base carrier 10a, while contacting ducts 13 are situated on a front side of base carrier 10a, laying opposite of the back side and projecting from the front side. In FIG. 2, it can be seen that each sliding contact element 31 is guided through base carrier 10a within contacting areas 32.

Then, tap-off device 2 can, for example, be plugged into these contacting areas 32 or can be connected in an electrically conductive manner by the electrical contacts. In this case, tap-off device 2 for this reason can be moved along bus bar 1 by contact device 100.

As can be seen from FIG. 2, 15 denotes a sheathed cable which supplies an external user, for example a production element, which could, by way of example only, be a motor, with electrical energy. FIG. 3 shows a tap-off device 2, in particular an empty tap-off device or connector module, which can serve to mechanically fix contact device 10.

Furthermore, tap-off device 2 may have an interlocking element 5 in the form of an interlocking hook 51 so that interlocking hook 51 clasps around and clamps contact device 10 at the periphery. Contact device 10 here described can thus be fastened to the bus bar by tap-off device 2. Moreover, it can be seen in this instance that interlocking hook 51 may have additional interlocking elements 510. These additional interlocking elements 510 can likewise be configured in the form of a plug connection, that is in the form of a clip connection. It is also possible that interlocking hook 51, instead of being laid at the periphery around contact device 10, is driven laterally into a latching system of contact device 10. Driving in the interlocking hook in such a way can form a plug connection. For this reason, after plugging in interlocking hook 51 in such way, it can be covered at least partially by tap-off device 2.

FIG. 4 shows contact device 100 according to the present invention in accordance with Figures 1 and 2 in a complete schematic perspective view.

It can be seen that protective circuit 21, connecting ducts 13 and also connecting housing 10 again are present. Protective circuit 21 (preferably with UL approval) serves to secure the preferably 2-pole contacting area 32. Additionally, it can be concluded from FIG. 4 that in this protective circuit a cover flap 16 completes connecting housing 10 and thus can be a part of connecting housing 10. For this reason, all additional components forming an electrically conductive connection between connecting ducts 13 and tap-off device 2 may be locked in by cover flap 16.

Electrically conductive connection 61 can be an electrically conductive cable, which is in electrically conductive connection with contacting areas 32 and is guided out of connecting housing 10 on the sides. For example, electrically conductive connection 61 may be part of sheathed cable 15. The present invention is not limited on the basis of the exemplary embodiments, but the present invention rather detects each new feature and each combination of features, in particular including any combination of features in the patent claims, even if this feature or combination of features themselves are not explicitly indicated in the patent claims or in the exemplary embodiments.

List of Reference Characters

| | |
|---|---|
| 1 | bus bar |
| 2 | tap-off device |
| 3 | power tab-off device |
| 5 | interlocking element |
| 10 | connecting housing |
| 10a | base carrier |
| 11 | installation surface |
| 13 | contacting ducts |
| 13a | interior surfaces |
| 15 | sheathed cable |
| 16 | cover flap |
| 20 | connecting element |
| 21 | protective circuit |
| 31 | sliding contact elements |
| 32 | contacting areas |
| 51 | interlocking hooks |
| 61 | electrically conductive connection |
| 100 | contact device |
| 510 | interlocking elements line |
| GND | Ground line |
| H10 | main extension plane |
| L1 | direction |
| L2 | sliding direction |

What is claimed is:

1. A contact device (100) for transmitting electrical energy from a bus bar (1) to a tap-off device (2) comprising:
   at least one connecting housing (10) having at least one partially open contacting duct (13) at a side facing the bus bar (1), in a direction parallel to the bus bar (1) such that at least one sliding contact element (31) extends at an interior surface (13A) of the at least one contacting duct (13) so that within the at least one contacting duct (13) an electrical line of the bus bar (1) is electrically contacted to the at least one contacting duct (13),
   wherein the bus bar (1) is mechanically connected to the tap-off device (2) via the connecting housing (10),
   wherein the connecting housing (10) includes at least one base carrier (10a) on which at least one connecting element (20), is mounted,
   a power tab-off device (3), which includes at least one sliding contact element (31) for diverting electrical energy from the bus bar (1), wherein the at least one sliding contact element (31) is guided through the base carrier (10a) and has a contacting area (32) on a side of the base carrier (10a) facing away from the bus bar (1), wherein at least one circuit board selected from the group of printed circuit boards consisting of a printed circuit board of the contact device (100), a printed circuit board of the tap-off device (2), and a printed circuit board of a motor is contactable in an electrically conductive manner, characterized in that the sliding contact elements (31) are configured in the form of sliding clip elements so that the connecting housing (10) is clipped onto the bus bar without using tools.

2. The contact device (100) as recited in claim 1, wherein the bus bar (1) is spatially fixed.

3. The contact device (100) as recited in claim 1, wherein the bus bar (1) is spatially movable.

4. The contact device (100) as recited in claim 1, wherein the tap-off device (2) is spatially fixed.

5. The contact device (100) as recited in claim 1, wherein the tap-off device (2) is spatially movable.

6. The contact device (100) as recited in claim 1, wherein the at least one connecting element (20) further comprises at least one terminal block.

7. The contact device (100) as recited in claim 1, characterized in that at least one contacting duct (13) extends away from the base carrier (10a) in a direction parallel to a main extension plane (H10) of the base carrier (10a).

8. The contact device (100) as recited in claim 1, characterized in that at least one contacting duct (13) is formed using plastic as a base material, and wherein at least one reinforcement element is disposed at least in part on the outside of the plastic material, and wherein the reinforcement element has a higher Shore D value than the base material.

9. The contact device (100) as recited in claim 8, wherein at least one of the reinforcement elements is encapsulated in the plastic base material.

10. The contact device (100) as recited in claim 7, characterized in that at least two contacting ducts (13) are situated one above the other in a direction perpendicular to the main extension plane (H10) of the base carrier (10a).

11. The contact device (100) as recited in claim 1, characterized in that the connecting housing (10) has at least one interlocking element (5) disposed on a side facing away from the bus bar (1).

12. The contact device (100) as recited in claim 1, characterized in that at least one power plug housing (6) is installed in a mechanically fixed manner to the connecting housing (10).

13. The contact device as recited in claim 1, characterized in that at least one power plug housing (6) is installed in a releasably mechanically fixed manner to the connecting housing (10).

14. The contact device (100) as recited in preceding claim 1, characterized in that at least one power plug housing (6) is held at the contact device (100) only by an interlocking element (5).

15. The contact device (100) as recited in preceding claim 11, characterized in that the interlocking element (5) is configured in the form of an interlocking hook (51), wherein the interlocking hook (51) is positioned at an outer periphery around a power plug housing (6) so that the power plug housing (6) is held at the contact device (100) by an interlocking element.

16. The contact device (100) as recited in claim 1, characterized in that the sliding contact elements (31) are integrally formed within the contact device (100).

* * * * *